United States Patent
Easwaran et al.

(10) Patent No.: US 6,831,975 B1
(45) Date of Patent: Dec. 14, 2004

(54) DIGITAL SUBSCRIBER LINE (DSL) MODEM COMPATIBLE WITH HOME NETWORKS

(75) Inventors: Prakash Easwaran, Bangalore (IN); Sandeep Oswal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 808 days.

(21) Appl. No.: 09/661,629

(22) Filed: Sep. 13, 2000

(51) Int. Cl.[7] .............................................. H04M 1/00
(52) U.S. Cl. .......................... 379/390.02; 379/387.02; 379/399.01; 379/413.02
(58) Field of Search ...................... 379/390.01–390.04, 379/394, 395, 392.01; 375/220, 222, 219, 261, 269, 376

(56) References Cited

U.S. PATENT DOCUMENTS

| | | | | |
|---|---|---|---|---|
| 5,345,162 A | * | 9/1994 | Shiojima ................... | 320/164 |
| 5,949,085 A | * | 9/1999 | Barrett ........................ | 250/551 |
| 6,067,316 A | | 5/2000 | Amrany et al. ............. | 375/220 |
| 6,137,839 A | | 10/2000 | Mannering et al. ......... | 375/260 |
| 6,285,865 B1 | | 9/2001 | Vorenkamp et al. ........ | 455/307 |
| 6,493,395 B1 | | 12/2002 | Isaksson et al. ............ | 375/261 |
| 6,532,215 B1 | | 3/2003 | Muntz ........................ | 370/242 |
| 6,542,540 B1 | | 4/2003 | Leung et al. ............... | 375/232 |
| 6,603,808 B1 | | 8/2003 | Anne et al. ................. | 375/222 |

* cited by examiner

*Primary Examiner*—Curtis Kuntz
*Assistant Examiner*—Tuan Pham
(74) *Attorney, Agent, or Firm*—Abdul Zindani; W. James Brady, III; Frederick J. Telecky, Jr.

(57) ABSTRACT

A cost-effective filter consuming low power and occupying minimal space. The filter may be used in a ADSL modem (or CPE) to filter the signal components other than the ADSL signals. A high pass filter first filters the low frequency components to attenuate (or remove) lower frequency components such as that caused by ADSL transmit echo signals and that used for voice transmission. The high pass filter may be modified by adding a few resistors to limit the voltages of the high frequency signals also. The output of the high pass filter is amplified and passed through a low pass filter to filter the high frequency components (HPNA included). Due to earlier filtering operation of the high pass filter, the signal can be amplified substantially before being sent to the low pass filter. The implementation of the low pass filter is simplified due to the prior amplification.

18 Claims, 2 Drawing Sheets

DIGITAL SUBSCRIBER LINE (DSL) MODEM COMPATIBLE WITH HOME NETWORKS

RELATED APPLICATIONS

The present application is related to the co-pending U.S. patent application entitled, "Low Noise Receiver Architecture for Client End ADSL AFE (Analog Front End) in a Low Voltage CMOS Process", Ser. No. 09/626,872, filed on Jul. 27, 2000, and is incorporated in its entirety herewith.

BACKGROUND OF THE INVENTION

1. Field of the Invention

The present invention relates to modems used in telecommunications and more specifically to a DSL modem which is compatible with home networks such as those based on home phone networking alliance (HPNA) standard.

2. Related Art

Digital subscriber line (DSL) technology is often used to provide high bandwidth connections to homes using local loops. Typically, each home contains what is commonly referred to as a customer premises equipment (CPE). The CPE may in turn contain (or interface with) a modem which receives (and transmits) signals representing digital data stream (a sequence of bits typically) encoded according to the ADSL specifications.

A modem may be connected to a telephone line, with potentially several telephone lines together providing connectivity to devices such as CPEs, telephone sets and facsimile machines. Usually, a signal (sent by a remote device) received on a local loop causes a corresponding signal to be transmitted on a telephone line and the receiving devices thus receive the signal on the telephone lines.

The devices using the telephone lines and the local loops are often designed to operate in different frequency bands such that the same medium (i.e., local loops and telephone lines) can be shared by many types of devices using frequency division multiplexing. For example, the telephone sets and facsimile machines operate in the 0–4 kHz band, a CPE transmitting according to ADSL (asymmetric DSL) uses 30–138 KHZ band to transmit upstream (i.e., from home to central office) and 180 kHz –1.1 MHZ band to receive downstream.

Accordingly, an ADSL modem (or an analog to digital converter (ADC) in the modem) is typically designed to sample a received signal in the 180 kHz –1.1 MHZ band, and the resulting samples may be analyzed to recover the data encoded according to ADSL specifications. Problems may be posed to the data recovery task when the telephone lines are shared for other purposes. As is well known, telephone lines are also used to provide connectivity between devices (such as computer systems) using specifications such as those developed by HPNA.

One problem resulting from the sharing of the telephone lines by home networking and DSL technologies, is that HPNA compatible transmissions are in the 4–10 MHZ band, and the signals in 4–10 MHZ band would alias into 180 KHZ –1.1 MHZ band. As is well known, such aliasing would lead to inaccurate recovery of the data unless a corrective action is taken.

The problem may be exacerbated by the fact that the HPNA signals are relatively strong (voltage swing of 0–2 Volts typically) compared to the ADSL related signals (few hundred milli-volts) particularly in the case of long local loops. As an illustration, if the ADSL signals component is desired to be amplified by a certain degree before sampling by an ADC, the ADC would need to operate at a fairly high voltage swing (due to the higher voltage strength of the HPNA signals) if the ADC were to sample the combined HPNA and ADSL signals. Operating at such high voltage swing may be undesirable in many environments at least due to the higher electrical power requirements. While the problem is described above with respect to ADSL for illustration, similar problems may be encountered with other types of DSL technologies also.

Accordingly, what is needed is a method and apparatus which enables a DSL modem to operate in conjunction with home networking technologies such as those based on HPNA.

SUMMARY OF THE INVENTION

An aspect of the present invention provides a filter which can be used in a ADSL modem (or CPE in general) to filter the undesirable components such that the filtered component is suitable for subsequent sampling. The filtered signal may be amplified by a suitable factor prior to the sampling.

In one embodiment, the filter is implemented as an analog bandpass filter which attenuates the HPNA signals to less than −150 dBm/Hz. The number −150 dBm/Hz represents the desired noise floor for the ADSL signals in several environments. Attenuation to such low desired levels using analog components may lead to solutions which require high electrical power, and may thus be undesirable.

Accordingly, in an alternative embodiment, the filter is implemented to contain a high pass filter, an amplifier and a low pass filter. The high pass filter filters the low frequency components such as the ADSL transmit echo signal and the telephone voice signal. The output of the high pass filter is amplified and then provided to a low pass filter, which filters the undesirable high frequency components such as the HPNA signals. Due to the prior amplification, the noise requirements of the low pass filter are reduced and the implementation is simplified.

According to yet another aspect of the present invention, the high pass filter is implemented to limit the high frequencies also to some extent. A resistor may be added in series with an input capacitance (of the high pass filter). The resistor attenuates the high frequency signals (including HPNA related) to some extent. When subsequent components are designed to operate with a desired voltage level ceiling, the attenuation (by the resistor) allows for greater amplification in such subsequent components. Specifically, in the described embodiments, the output signals of the resistors (or the high pass filter) may be amplified to a greater extent prior to passing through the low pass filter, thereby further simplifying the implementation of the low pass filter.

According to one more aspect of the present invention, an equalizer may be included between the high pass filter and the low pass filter. The equalizer compensates for the difference of attenuations different frequency components are subjected to when transmitted on local loops. The output of the low pass filter is sampled to generate multiple samples at a high frequency. The samples may be examined later to recover the data encoded in the ADSL signal component.

According to yet another aspect of the present invention, the entire filter may be provided as one monolithic integrated circuit. Such a degree of integration may be enabled by the other aspects of the present invention noted above. The filter may be integrated with other components of a CPE also. In general, implementation as a single monolithic integrated circuit leads to lower costs and may be important at least in consumer type environments.

Therefore, the present invention may be used in ADSL type environments as a filter can be provided which filters the undesirable components while minimizing power and space requirements.

The present invention can be used to minimize the power requirements as a high pass filter can first filter the low frequency components and attenuate to a limited extent the higher frequency components.

The present invention can be used to simplify the implementation of a low pass filter as the signal can be amplified substantially in prior stages due to the operation of a high pass filter.

The present invention can be used to minimize the overall cost of implementation as the filter and other components of a modem/CPE can be implemented as a single (monolithic) integrated circuit.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein.

DETAILED DESCRIPTION OF THE PREFERRED EMBODIMENTS

1. Overview and Discussion of the Invention

Filters which attenuate the HPNA related signals to less than the noise floor of the ADSL signals are provided in accordance with an aspect of the present invention. In many ADSL environments, the desired noise floor is −150 dBm/Hz (decibel milli per hertz). For further details of ADSL, the reader is referred to a document entitled, "ITU-T Recommendation: G.922.1: Asymmetrical Digital Subscriber Loop Transmission" dated July 1999, and is available from International Telecommunication Union, and the document is incorporated in its entirety into the present application.

The invention is described with reference to an example environment for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Environment

Figure 1:
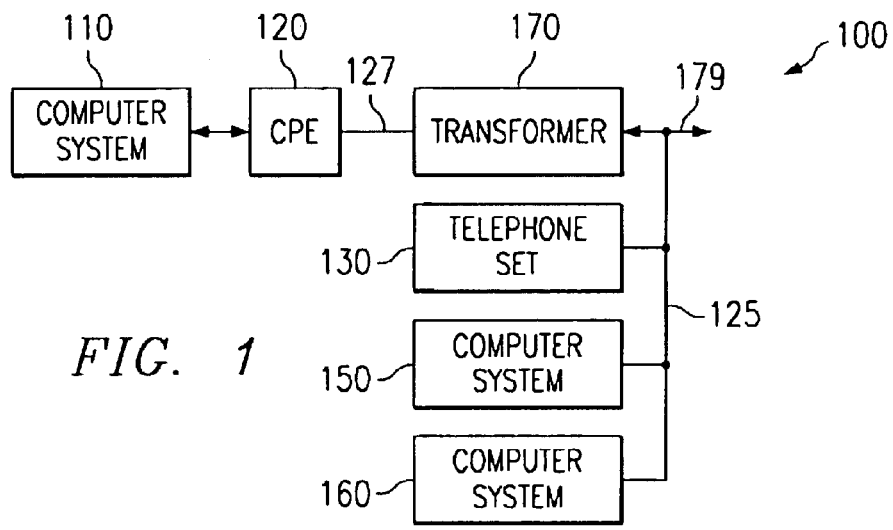
FIG. 1 is a block diagram illustrating an example environment in which the present invention can be implemented.

FIG. 1 is a block diagram illustrating an example environment in which the present invention can be implemented. The environment is shown containing computer system 110, CPE 120, telephone set 130, computer systems 150 and 160, and transformer 170. The frequency band at which each of the components communicates is depicted in FIG. 2.

Figure 2:
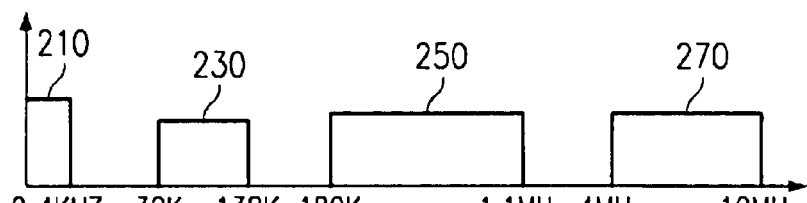
FIG. 2 is a diagram depicting the frequencies at which different devices of FIG. 1 communicate.

Continuing with combined reference to FIGS. 1 and 2, telephone set 130 enables telephone conversations between end users using frequency band 210 (i.e., 0–4 KHZ) on telephone line 127, and may be implemented in a known way. Computer systems 150 and 160 may be implemented to communicate with each other using HPNA standard using frequency band 270 (i.e., 4–10 MHZ) on telephone line 127, and may also be implemented in a known way.

Transformer 170 provides connectivity between local loop 179 and telephone line 127 in a known way. As is well known, when a signal is received on local loop 179, the transformer action causes a similar signal component to be generated on telephone line 127. Transformer 170 causes signals to be transmitted on local loop 179 in response to signals generated on telephone line 127.

It should be understood that transformer 170 may be integrated into CPE 120 as one unit. Similarly, the other units (i.e., telephone set 130 and computer systems 150 and 160) connected to local loop 179 also typically contain transformers. Transformers may be implemented in a known way.

Assuming that CPE 120 operates consistent with ADSL specification, CPE 120 may transmit data using frequency band 230 (i.e., 30–138 KHZ) on telephone line 127, and the transmit operation may be performed in a known way. During reception, CPE 120 receives a signal which contains DSL data (band 250), any transmissions according to the HPNA specifications (band 270), and voice band 210. The manner in which CPE 120 recovers the data in DSL data channel in accordance with various aspects of the present invention is described below.

3. CPE 120

Figure 3:
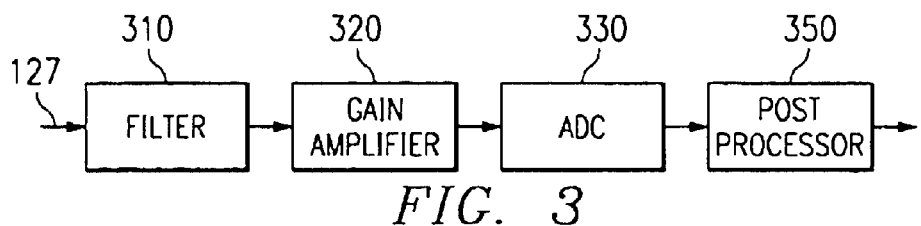
FIG. 3 is a block diagram illustrating the details of a CPE/Modem as relevant to the reception of ADSL data according to an aspect of the present invention.

FIG. 3 is a block diagram of CPE 120 illustrating the details as relevant to the recovery of data in the ADSL channel received on telephone line 127 (from local loop 179). CPE 120 is shown containing filter 310, gain amplifier 320, analog to digital converter (ADC) 330, and post processor 350. Each component is described below in further detail.

ADC 330 may be implemented to generate 12 bit samples at a frequency of 4.416 Mega Samples per Second. ADC 330 may be implemented for a voltage swing of about 3 Volts. Gain amplifier 320 receives the output of filter 310 and amplifies the received signal by about 36 Db to generate the input to ADC 330. In an embodiment, ADC 330 and gain amplifier 320 may be integrated as one unit, and be referred to as a analog front end (AFE). Post processor 350 processes the samples generated by ADC 330 to recover the data encoded in the ADSL channel (band 250). ADC 330 gain amplifier 320, and post processor 350 may be implemented in a known way.

In one embodiment, filter 310 is implemented as an analog filter containing components such as resistors and capacitances. The signal received on telephone line 127 contains the four bands 210, 230, 250 and 270 of FIG. 2. The undesirable HPNA related signals of band 270 need to be attenuated by 90 dB such that the attenuated HPNA signals would have a signal strength of less than the desired noise floor of −150 dBm/Hz.

Thus, by attenuating the HPNA signals to less than −150 dBm/Hz strength, one can ensure that the aliased component (which is part of the undesirable noise) is below the noise floor of the ADSL signal. That is, the signal quality is not further degraded due to the HPNA signal component. The result is that the data recovery rate (of the ADSL channel) is not degraded by the presence of the HPNA signals on telephone line 127.

The above goal of attenuation (of HPNA signal by 90 dB) can be achieved by a $6^{th}$ order low pass filter. The low pass filter may be implemented using either active or passive components. In the case of passive components (physical resistors, capacitors as external components), the overall cost of implementing filter 310 is enhanced, and may be unacceptable particularly in consumer markets where cost is of particular importance. In addition, the passive components may occupy an unacceptable amount of space, and thus the solution may be further undesirable.

Using active components overcomes at least some of the problems (i.e., space and cost) since filter 310 can be implemented as an integrated circuit. However, a $6^{th}$ order filter may consume a high amount of electrical energy and may thus be undesirable. Furthermore, it may be desirable to filter the lower frequency components (bands 210 and 230 of FIG. 2) prior to sampling, and a $12^{th}$ order filter may be required, which further adds to the problems due to the high energy requirements. As described below in further detail, an alternative embodiment of filter 310 overcomes at least some of the problems noted above.

4. Filter 310

Figure 4:
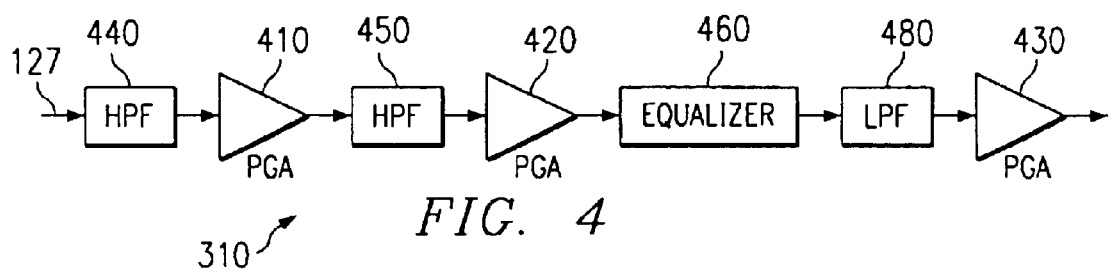
FIG. 4 is a block diagram illustrating the details of a filter which enables the recovery of data encoded in ADSL signals in accordance with an aspect of the present invention.

FIG. 4 is a block diagram illustrating the details of an embodiment of filter 310. Filter 310 is shown containing programmable gain amplifiers (PGA) 410, 420 and 430, high pass filters (HPF) 440 and 450, equalizer 460, and low pass filter 480. Each component is described below in further detail.

PGA 410 amplifies the signal received on telephone line 127. The amplification gain depends on the strength of the input signal and may be determined by an external component (not shown). As is well known, the ADSL signals may be received at a strength of as high as 12 Volts (for short loops) and as low as 30 Milli-volts (for long loops). Accordingly, in one embodiment, the gain PGA 410 may be set to a value between −12 dB and +20 dB for 12 Volts and 30 milli-volts signal respectively to give a maximum internal swing of 3 Volts.

HPFs 440 and 450 may be implemented similarly and the description is provided only with reference to HPF 450 for conciseness. However, the description is applicable to HPF 440 as well. HPF 450 removes the low frequency bands up to a cut-off frequency of 180 kHz. It should be understood that the removed components include band 230, which results from any parallel transmissions (also referred to as a local echo) according to the ADSL specifications.

As the ADSL signals may be transmitted with a peak to peak voltage level of 18 Volts differential, the high voltage components are absent in the output of HPF 450. As a result, the signal can be amplified further more in the subsequent stages, thereby simplifying the implementation of LPF 480. Example embodiments of HPF 450 are described below with reference to FIGS. 6A and 6B. PGA 420 may thus amplify the output of HPF 450. PGA 420 may amplify the signal by an amplification factor of as high as 30 dB to attain a voltage swing of 3 Volts.

Equalizer 460 compensates for the different attenuations which signal components of different frequencies are subjected to when being passed on local loop 179. That is, as is well known in the relevant arts, the higher frequency components are attenuated more than lower frequency signals. Thus, equalizer 460 amplifies the higher frequency components more than the lower frequency components. Equalizer 460 may be implemented in a known way.

LPF 480 receives the output of equalizer 460 and attenuates frequency components above the cut-off frequency of 1.1 MHZ. As the signal has been amplified already (by PGAs 410, 420, and 430), the desired noise floor of the ADSL signal is also higher. As a result, LPF 480 may be implemented easily without degrading further the quality of the ADSL signal component. For example, assuming that the prior components amplify the signal by 30 dB, the noise floor of ADSL signal is now −120 dBm/Hz (from a prior value of −150 dBm/Hz), and LPF 480 needs to be implemented with this higher noise floor.

In one embodiment, LPF 480 is implemented as a $4^{th}$ order elliptic filter followed by a $2^{nd}$ order filter. The filtering is broken down into two stages so as to have independent control over the zeros of the transfer function and maximize the attenuation. The zeros may be placed at 4.7 MHZ and 6.1 MHZ to achieve the desired attenuation of the HPNA signals. As LPF 480 is placed after the PGAs, the noise specification of these two filters is reduced, and may be implemented with minimal power consumption.

PGA 430 may correspond to gain amplifier 320, and may be implemented to amplify the output of LPF 480. In an embodiment, the amplification factor of PGA 430 can be as high as 9 dB. In general, the amplification factors of PGAs 410, 420 and 430 need to be chosen such that the entire voltage range of ADC 330 is taken advantage of, and also to avoid saturating any of the other components in the path. PGAs 410, 420 and 430 may be implemented in a known way. The description is continued with example embodiments of HPF 450.

5. High Pass Filter

Figure 6A:
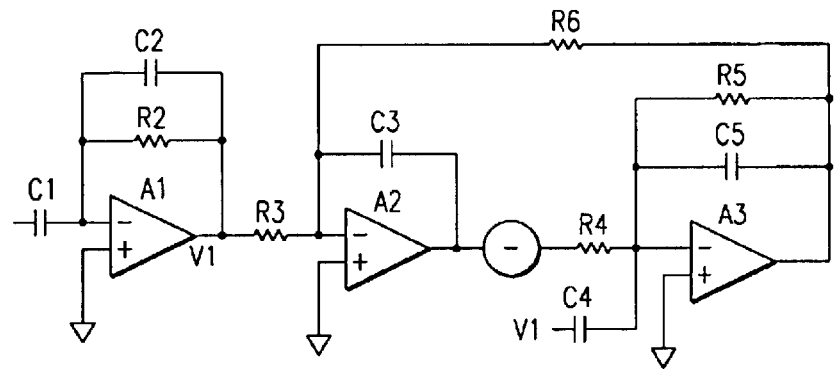
FIG. 6A is a block diagram illustrating the details of an embodiment of a high pass filter.

FIG. 6A is a block diagram illustrating the details of high pass filter (HPF) 450 in one embodiment. HPF 450 is shown containing capacitors C1–C5, resistors R2–R5, and differential amplifiers A1–A3. Differential amplifier A1 may be viewed as being in a first stage and the other amplifiers A2 and A3 may be viewed as being in a second stage. The operation of each stage is described below in further detail.

With respect to the first stage, the gain (V1/Vi) is given by the equation −Zf/Zi, wherein Zf represents the impedance of the feedback path and Zi represents the impedance of the capacitance C1. In an embodiment, C1 and C2 are chosen to have a capacitance of the order of few hundred Pico farads, and R2 is chosen to have a resistance of 200 Ohms. As is well known, the first stage operates as a high pass filter.

In general, R2 may be chosen from load driving capability of differential amplifier A1, noise contribution of the resistor at the output and reasonable values that can be manufactured in integrated circuits. C2 may be chosen such that the HPF pole (given by ½*pi*R2*C2) is at the desired location. In this case this is determined by the composite transfer function of the first and second stage. C1 may be chosen to fix the pass-band gain of this stage determined by the ratio C1/C2.

The second stage of the HPF is a second order high pass transfer function with one zero and two poles as compared to the first stage which just has one pole. The location of the poles and zero are determined by the R and C values.

Figure 5:
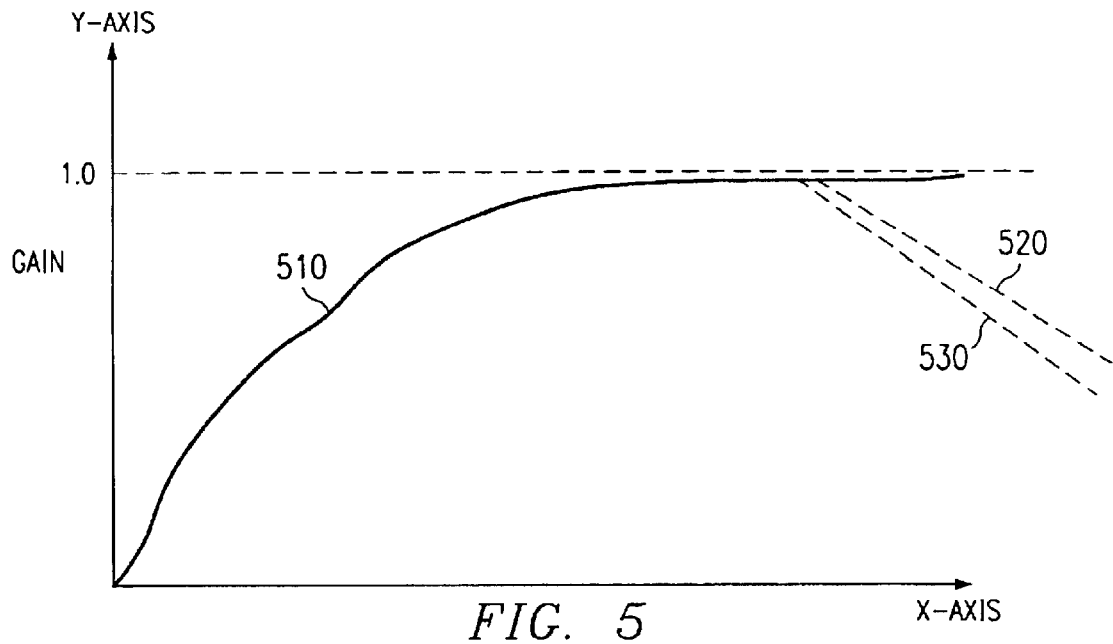
FIG. 5 is a graph illustrating the frequency response of the embodiments of FIGS. 6A and 6B.

The gain of components with different frequencies due to the operation of HPF 450 (of FIG. 6A) is depicted in FIG. 5. Line 510 indicates that at high frequencies, the gain approaches one, implying that the high frequency components are passed without attenuation. Lines 520 and 530 are described below with reference to FIG. 6B.

It may be noted that the output of HPF 450 of FIG. 6A contains band 270 (HPNA signals), which have a relatively high voltage level. The high voltage levels limit the amplification levels in PGA 420, assuming that it is upper voltage limit of the amplified signal is set at a desired pre-set value. However, substantial attenuation (amounting to near removal) of band 270 may require that HPF 450 be replaced by a band-pass filter, which is undesirable at least for reasons noted above.

Figure 6B:
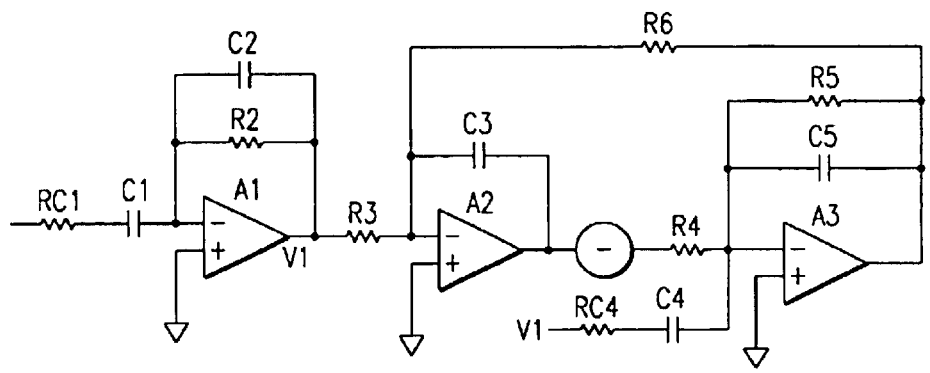
FIG. 6B is a block diagram illustrating the details of an alternative embodiment of a high pass filter.

Accordingly, in an alternative embodiment described with reference to FIG. 6B, HPF 450 is modified to operate as a band limiting filter in addition to a high pass filter. Only the modifications relative to FIG. 6A are described for clarity and conciseness. Resistances RC1 and RC4 are disposed in series with input capacitances C1 and C4 respectively. RC1 (RC4) has substantially more resistance than the inherent input resistance of C1 (C4). In an embodiment, RC1 and RC4 each have resistances of the order of a few thousand ohms. RC4 and C4 are referred to as being input resistance and capacitance of the second stage for the high pass filter.

Line 520 of FIG. 5 depicts the gain as a function of frequency when only resistance RC1 (but not RC4) is added to the FIG. 6A. As may be appreciated, the addition of resistance RC1 causes HPF 450 to limit the input signal at higher frequencies. Line 530 depicts the response when resistance RC4 is also added.

Thus, by using resistances RC1 and RC4, the HPNA signals of band 270 can be attenuated to some degree. As a result, the signal can be amplified further in PGA 420 before passing through LPF 480. Due to the amplification, the implementation of LPF 480 is simplified, yet using minimal electrical power. In addition, the resistances RC1 and RC4 can be implemented with fairly minimal additional cost as the resistances can be easily incorporated into a single integrated circuit implementing CPE 120. Thus, an aspect of the present invention provides a low cost filter which consumes minimal power.

6. Conclusion

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A device for accurately generating a plurality of samples representing data encoded according to a digital subscriber line (DSL) specification, said data being encoded in a DSL signal and being received on a telephone line, said telephone line being shared by other devices used for home networking, said device comprising:

a filter coupled to said telephone line, said filter receiving an input signal on said telephone line and attenuating signal components corresponding to said home networking to generate a filtered output;

a first amplifier amplifying said filtered output to generate an amplified signal; and an analog to digital converter (ADC) sampling said amplified signal to generate said plurality of samples; wherein said filter comprises a high pass filter including a first resistor in series with an input capacitance, wherein said first resistor has a resistance substantially more than the internal resistance of said input capacitance.

2. The device of claim 1, wherein said filter further comprises:

a second amplifier amplifying the output of said high pass filter, and a low pass filter filtering attenuating the signal components corresponding to said home networking to a level less than a desired noise floor in an environment based on said DSL, wherein said high pass filter filtering any DSL transmission echoes received on said telephone line, said high pass filter further filtering any voice communications also received on said telephone line.

3. The device of claim 2, wherein said high pass filter further attenuates high frequency components including said signal components corresponding to said home networking, wherein the attenuations of said high frequency components enables said second amplifier to be implemented with a higher gain.

4. The device of claim 3, wherein said DSL comprises Asymmetric DSL (ADSL), and said home networking is performed according to home phone networking alliance (HPNA) standard, wherein said desired noise floor equals −150 dBM/Hz.

5. The device of claim 3, wherein said first resistor causes said attenuations of said high frequency components.

6. The device of claim 5, further comprising a second resistor in series with another stage contained in said high pass filter.

7. The device of claim 3, further comprising an equalizer disposed between said high pass filter and said low pass filter, said equalizer compensating for the different attenuations to which different frequency signal components of said ADSL signal are subjected to when transmitted on a local loop.

8. The device of claim 1, wherein said filter is implemented as an analog filter.

9. The device of claim 8, wherein said analog filter is implemented using active components.

10. The device of claim 8, wherein said analog filter is implemented using passive components.

11. The invention of claim 1, wherein said device comprises a modem or a customer premises equipment (CPE).

12. The device of claim 2, wherein said filter is implemented as a monolithic integrated circuit.

13. A filter for processing a signal received on a telephone line, said telephone line being shared by a customer premise equipment (CPE) operating according to a digital subscriber line (DSL) standard, said telephone line being shared by other devices used for home networking, said filter comprising:

a high pass filter filtering any DSL transmission echos received on said telephone line, said high pass filter further filtering any voice communications also received on said telephone line, wherein said high pass filter comprises a first resistor in series with an input capacitance, wherein said first resistor has a resistance substantially more than the internal resistance of said input capacitance;

an amplifier amplifying the output of said high pass filter, and a low pass filter attenuating the signal components corresponding to said home networking to a level less than a desired noise floor.

14. The filter of claim 13, wherein said high pass filter further attenuates high frequency components including said signal components corresponding to said home networking, wherein the attenuations of said high frequency components enables said amplifier to be implemented with a higher gain.

15. The filter of claim 14, wherein said DSL comprises Asymmetric DSL (ADSL), and said home networking is performed according to home phone networking alliance (HPNA) standard, wherein said desired noise floor equals −150 dBM/Hz.

16. The filter of claim 14, wherein said first resistor causes said attenuations of said high frequency components.

17. The filter of claim 16, further comprising a second resistor in series with another stage contained in said high pass filter.

18. The filter of claim 13, wherein said high pass filter, said amplifier and said low pass filter are implemented in a monolithic integrated circuit.

* * * * *